(12) United States Patent
Juengling

(10) Patent No.: US 6,753,220 B2
(45) Date of Patent: *Jun. 22, 2004

(54) SEMICONDUCTOR PROCESSING METHODS OF FORMING DEVICES ON A SUBSTRATE, FORMING DEVICE ARRAYS ON A SUBSTRATE, FORMING CONDUCTIVE LINES ON A SUBSTRATE, AND FORMING CAPACITOR ARRAYS ON A SUBSTRATE, AND INTEGRATED CIRCUITRY

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/262,481

(22) Filed: Sep. 30, 2002

(65) Prior Publication Data

US 2003/0049902 A1 Mar. 13, 2003

Related U.S. Application Data

(60) Continuation of application No. 09/036,701, filed on Mar. 6, 1998, now Pat. No. 6,482,731, which is a division of application No. 08/742,895, filed on Nov. 1, 1996, now Pat. No. 5,998,256.

(51) Int. Cl.[7] .......................................... H01L 21/8242
(52) U.S. Cl. ....................... 438/253; 438/396
(58) Field of Search ................. 438/238–240, 438/253–256, 396–399

(56) References Cited

U.S. PATENT DOCUMENTS 4,959,698 A    9/1990  Shinichi
5,155,573 A   10/1992  Abe et al.
5,185,282 A    2/1993  Lee et al.
5,200,355 A    4/1993  Choi et al.
5,236,853 A    8/1993  Hsue
5,310,693 A    5/1994  Hsue
5,313,089 A    5/1994  Jones, Jr.
5,330,924 A    7/1994  Huang et al.
5,364,809 A   11/1994  Kwon et al.
5,394,000 A    2/1995  Ellul et al.
5,403,767 A    4/1995  Kim
5,407,532 A    4/1995  Fang et al.
5,438,011 A    8/1995  Blalock et al.
5,444,005 A    8/1995  Kim et al.
5,480,826 A    1/1996  Sugahara et al.
5,482,885 A    1/1996  Lur et al.
5,496,757 A    3/1996  Rosner
5,597,755 A    1/1997  Ajika et al.
5,604,696 A    2/1997  Takaishi
5,619,393 A    4/1997  Summerfelt et al.
5,627,094 A    5/1997  Chan et al.
5,686,337 A   11/1997  Koh et al.
5,691,551 A   11/1997  Eimori
5,700,706 A   12/1997  Juengling (List continued on next page.)

Primary Examiner—H. Jey Tsai
(74) Attorney, Agent, or Firm—Wells St. John P.S.

(57) ABSTRACT

Semiconductor processing methods include forming a plurality of patterned device outlines over a semiconductor substrate, forming electrically insulative partitions or spacers on at least a portion of the patterned device outlines, and forming a plurality of substantially identically shaped devices relative to the patterned device outlines. Individual formed devices are spaced from at least one other of the devices by a distance no more than a width of one of the electrically insulative spacers. In such manner, device pitch is reduced by almost fifty percent. According to one aspect, elongated electrically conductive lines are formed. According to another aspect, capacitors are formed which, according to a preferred embodiment form part of a dynamic random access memory (DRAM) array.

23 Claims, 12 Drawing Sheets

U.S. PATENT DOCUMENTS

| | | |
|---|---|---|
| 5,700,709 A | 12/1997 | Park et al. |
| 5,712,202 A | 1/1998 | Liaw et al. |
| 5,757,612 A | 5/1998 | Acosta et al. |
| 5,793,076 A | 8/1998 | Fazan et al. |
| 5,796,133 A | 8/1998 | Kwon et al. |
| 5,796,136 A | 8/1998 | Shinkawata |
| 5,837,577 A | 11/1998 | Cherng |
| 5,844,274 A | 12/1998 | Tsutsumi |
| 5,866,453 A | 2/1999 | Prall et al. |
| 5,998,225 A | 12/1999 | Crenshaw et al. |
| 5,998,256 A | 12/1999 | Juengling |
| 6,030,866 A | 2/2000 | Choi |
| 6,096,636 A | 8/2000 | Manning |

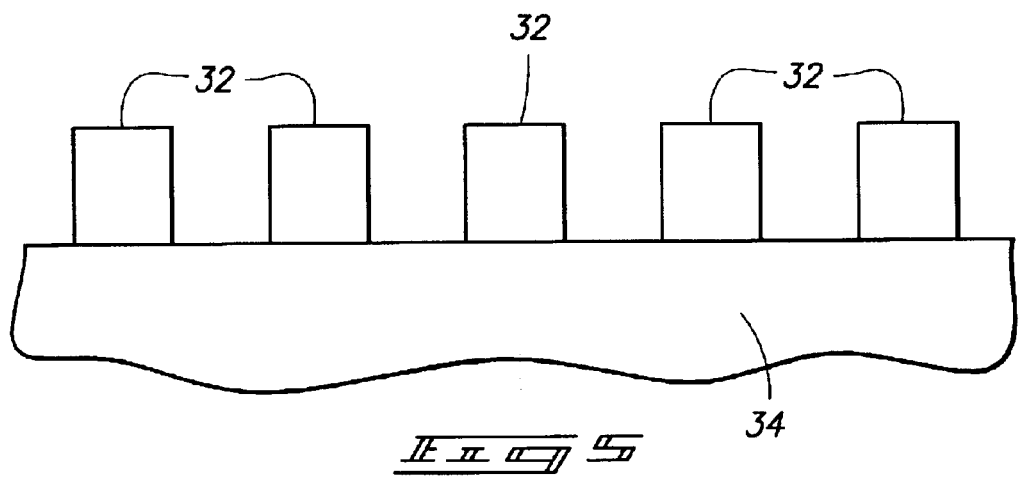
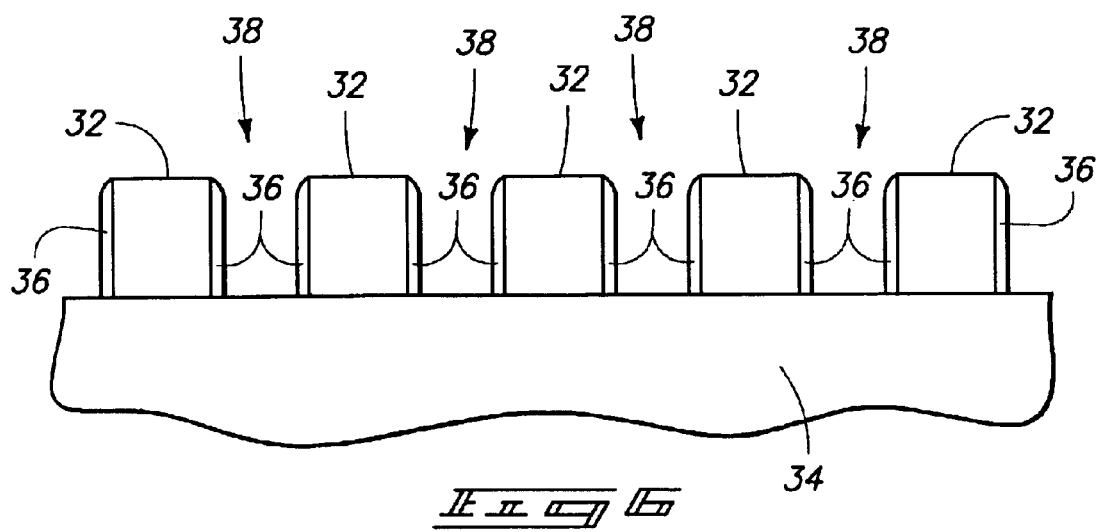

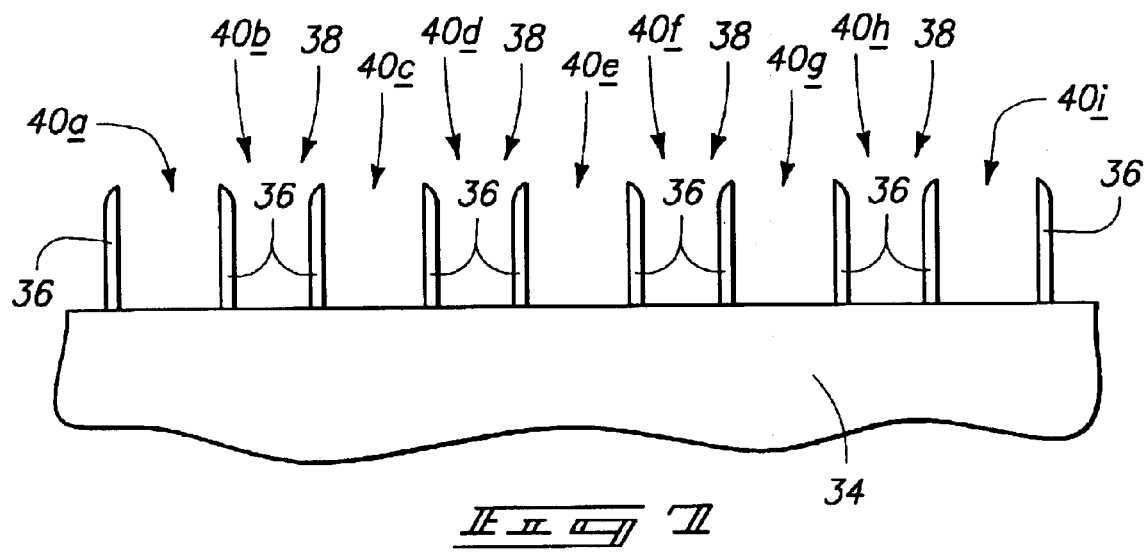
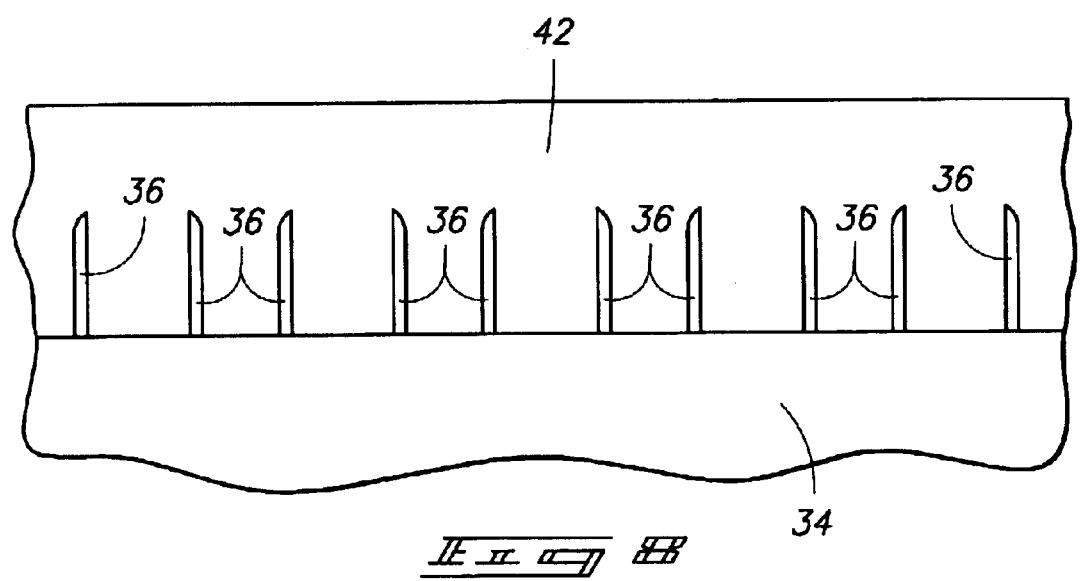

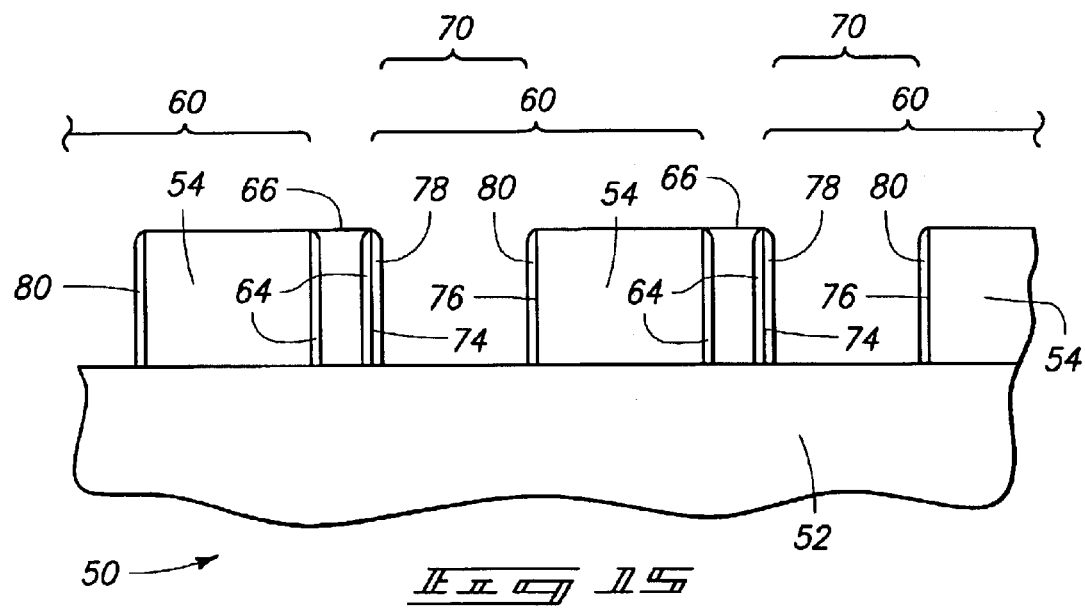
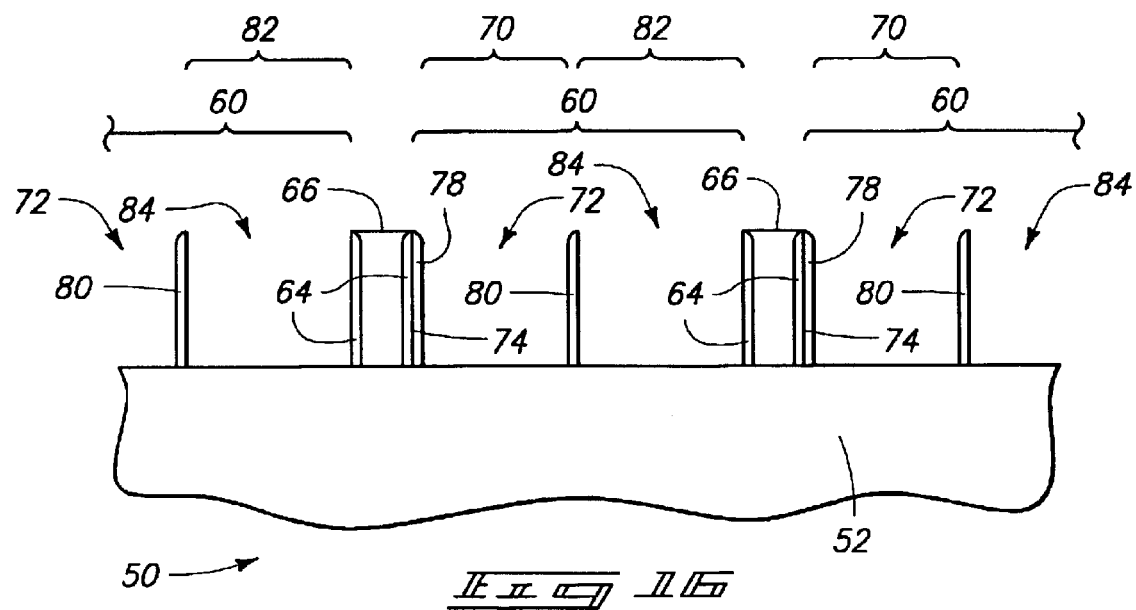

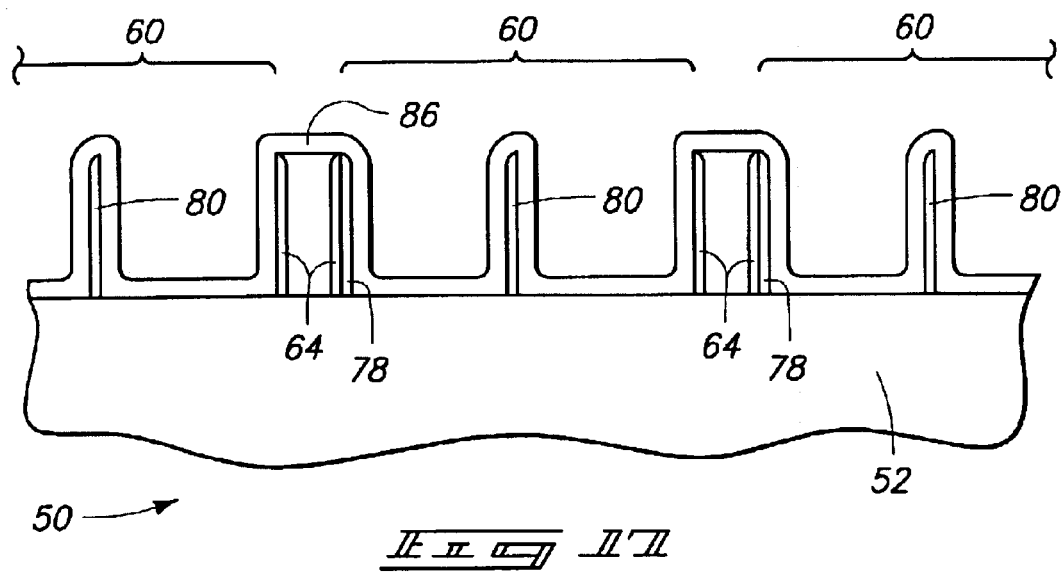
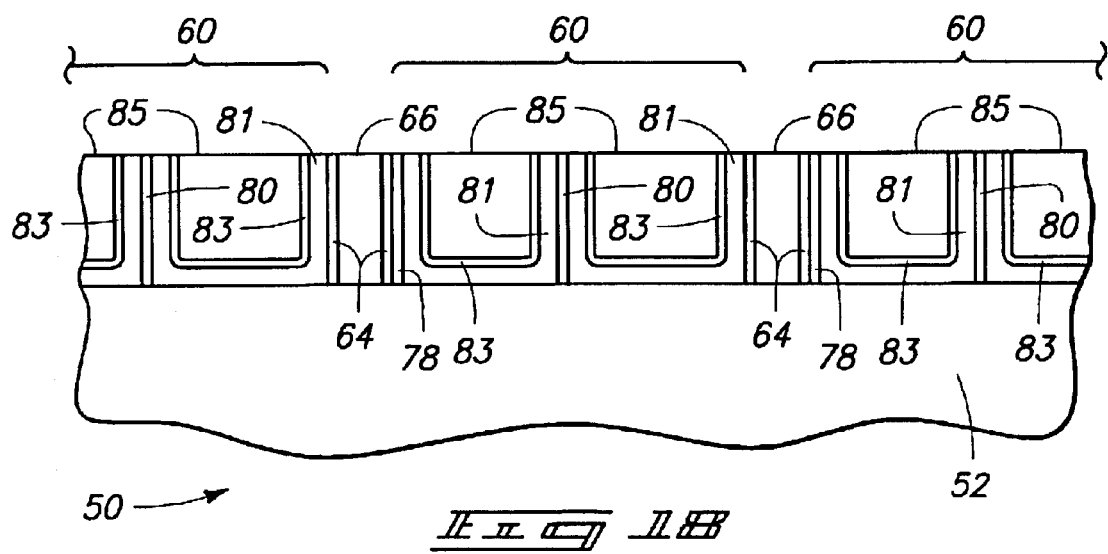

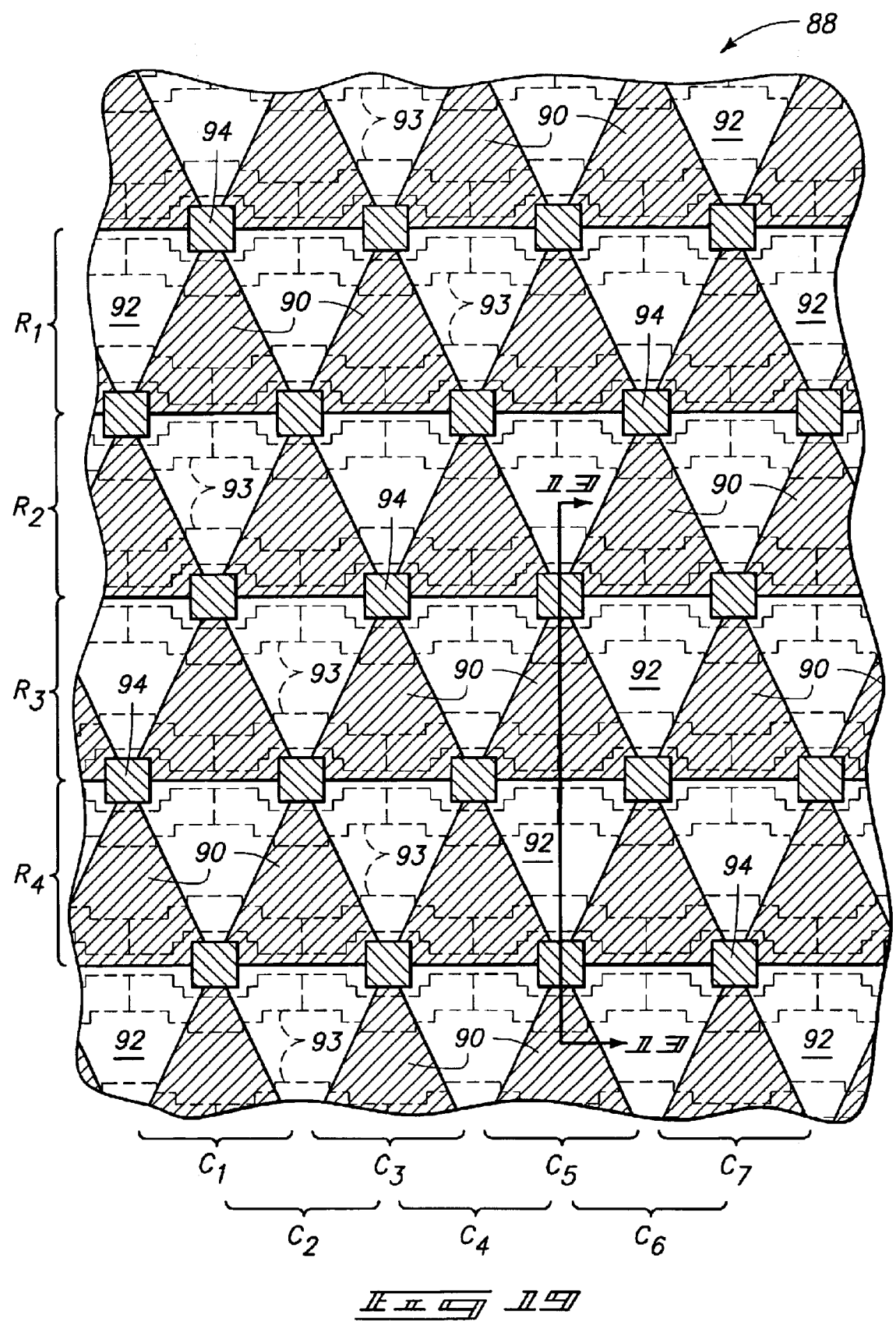

US 6,753,220 B2

SEMICONDUCTOR PROCESSING METHODS OF FORMING DEVICES ON A SUBSTRATE, FORMING DEVICE ARRAYS ON A SUBSTRATE, FORMING CONDUCTIVE LINES ON A SUBSTRATE, AND FORMING CAPACITOR ARRAYS ON A SUBSTRATE, AND INTEGRATED CIRCUITRY

RELATED PATENT DATA

This patent resulted from a continuation application of U.S. patent application Ser. No. 09/036,701, filed on Mar. 6, 1998, now U.S. Pat. No. 6,482,731 which is a divisional application of U.S. patent application Ser. No. 08/742,895, filed Nov. 1, 1996, now U.S. Pat. No. 5,998,256, entitled "Semiconductor Processing Methods of Forming Devices on a Substrate, Forming Device Arrays on a Substrate, Forming Conductive Lines on a Substrate, and Forming Capacitor Arrays on a Substrate, and Integrated Circuitry", naming Werner Juengling as inventor, the disclosure of which is incorporated by reference.

TECHNICAL FIELD

This invention relates to semiconductor processing methods of forming devices on or over a substrate, forming device arrays on or over a substrate, forming conductive lines on or over a substrate, and forming capacitor arrays on or over a substrate. The invention also relates to semiconductor device arrays, and in particular to series of conductive lines and capacitor arrays.

BACKGROUND OF THE INVENTION

Circuit devices which are fabricated on or over semiconductor wafers typically undergo one or more photolithographic steps during formation. During such photolithographic steps, device features can be etched using conventional techniques. The spacing between such devices is important because often times adjacent devices must be electrically isolated from one another to avoid undesirable shorting conditions.

One of the limitations on device spacing stems from limitations inherent in the photolithographic process itself. In the prior art, devices are generally spaced only as close as the photolithographic limit will permit.

By way of example and referring to FIGS. 1 and 2, a semiconductor wafer fragment is indicated generally by reference numeral 25. Fragment 25 includes a substrate 29 atop which a material 28 is provided. A plurality of patterned masking layers 26 are formed atop material 28.

Referring to FIG. 3, material 28 is anisotropically etched to form lines 30 atop substrate 29. As shown, individual lines have respective widths $L_1$ which constitute the minimum photolithographic feature size available for a line. Typically, a separation $S_1$ separates adjacent lines across the substrate as shown. Such dimension is typically only slightly larger than $L_1$ but could be the same as $L_1$. The term "pitch" as used in this document is intended to be in its conventional usage, and is defined as the distance between one edge of a device and the corresponding same edge of the next adjacent device. Accordingly and in the illustrated example, the pitch between adjacent lines $P_1$ (i.e., from the left illustrated edge of one line to the left illustrated edge of the next immediately adjacent line) is equal to the sum of $L_1$ and $S_1$, As integrated circuitry gets smaller and denser, the need to reduce spacing dimensions or pitch, such as $S_1$ and $P_1$, becomes increasingly important. This invention grew out of the need to reduce the size of integrated circuits, and particularly the need to reduce spacing dimensions and pitches between adjacent devices over a semiconductor wafer.

SUMMARY OF THE INVENTION

The invention includes semiconductor processing methods and related integrated circuitry in which a plurality of patterned device outlines are formed over a semiconductor substrate. Electrically insulative partitions or spacers are then formed on at least a portion of the patterned device outlines, after which a plurality of substantially identically shaped devices are formed relative to the patterned device outlines. Individual formed devices are spaced from at least one other of the devices by a distance substantially no more than a width of one of the electrically insulative spacers.

According to one aspect of the invention, elongated electrically conductive lines are formed. According to another aspect of the invention, capacitors are formed. In one preferred implementation of the latter aspect, a pair of adjacent capacitor containers are formed over a substrate by etching a first capacitor container opening having at least one sidewall. An electrically insulative spacer is formed over the sidewall. A second capacitor container opening is etched selectively relative to the spacer. Capacitors are then formed in the capacitor containers in a manner such that adjacent capacitors have a separation distance which is substantially no greater than the width of the spacer between the adjacent capacitors.

A novel masking layout is provided which allows capacitors to be formed in a manner which reduces device pitch by almost 50%. Such is particularly adaptive for use in fabrication of DRAM circuitry.

BRIEF DESCRIPTION OF THE DRAWINGS

Preferred embodiments of the invention are described below with reference to the following accompanying drawings.

FIG. 5 is a side view of the FIG. 4 semiconductor wafer fragment.

FIG. 6 is a view of the FIG. 5 semiconductor wafer fragment at a processing step subsequent to that shown by FIG. 5.

FIG. 7 is a view of the FIG. 5 semiconductor wafer fragment at a processing step subsequent to that shown by FIG. 6.

FIG. 8 is a view of the FIG. 5 semiconductor wafer fragment at a processing step subsequent to that shown by FIG. 7.

FIG. 15 is a view of the FIG. 11 semiconductor wafer fragment at a processing step subsequent to that shown by FIG. 14.

FIG. 16 is a view of the FIG. 11 semiconductor wafer fragment at a processing step subsequent to that shown by FIG. 15.

FIG. 17 is a view of the FIG. 11 semiconductor wafer fragment at a processing step subsequent to that shown by FIG. 16.

FIG. 18 is a view of the FIG. 11 semiconductor wafer fragment at a processing step subsequent to that shown by FIG. 17.

FIG. 19 is a top plan view of a portion of a semiconductor mask layout in accordance with one aspect of the invention.

DETAILED DESCRIPTION OF THE PREFERRED EMBODIMENTS

Figure 1:
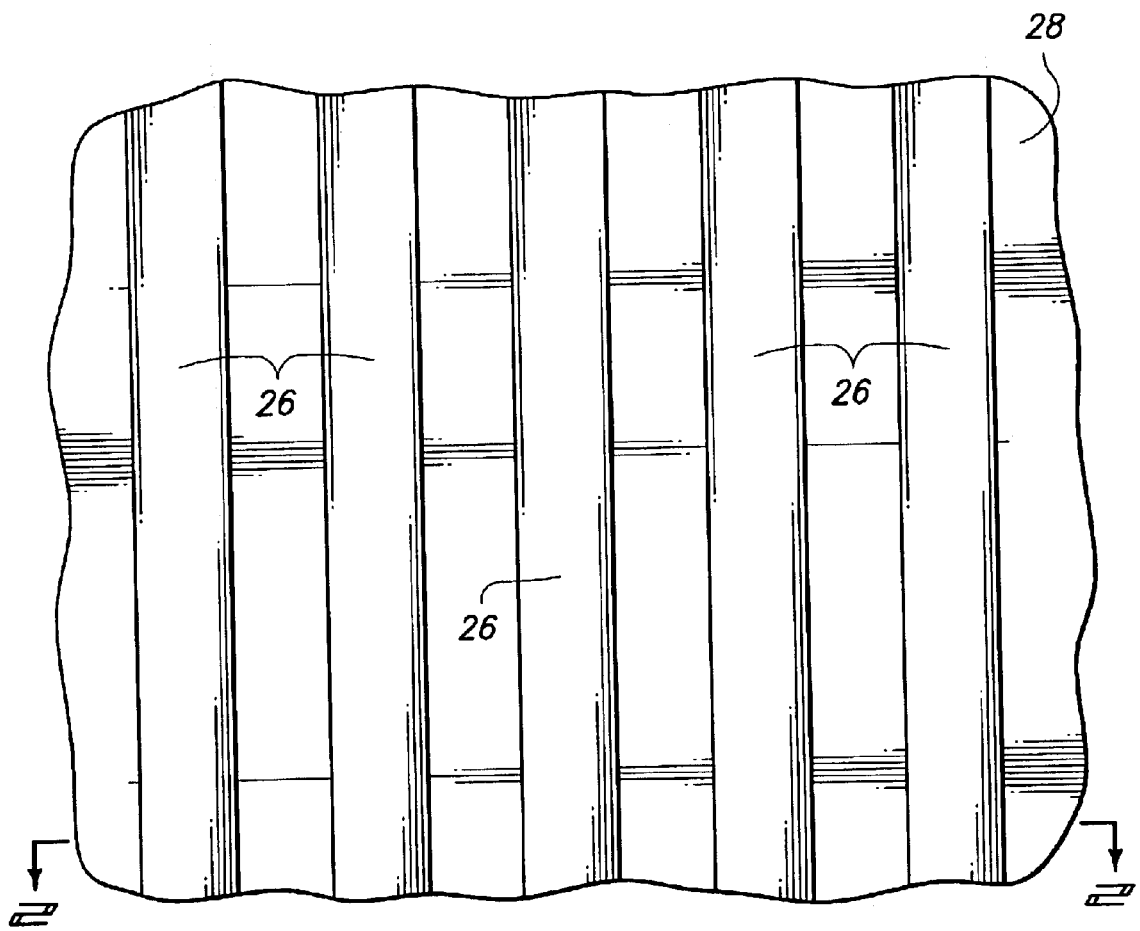
FIG. 1 is a top plan view of a prior art semiconductor wafer fragment atop which a plurality of masking layers are formed, and is discussed in the "Background" section above.
Figure 2:
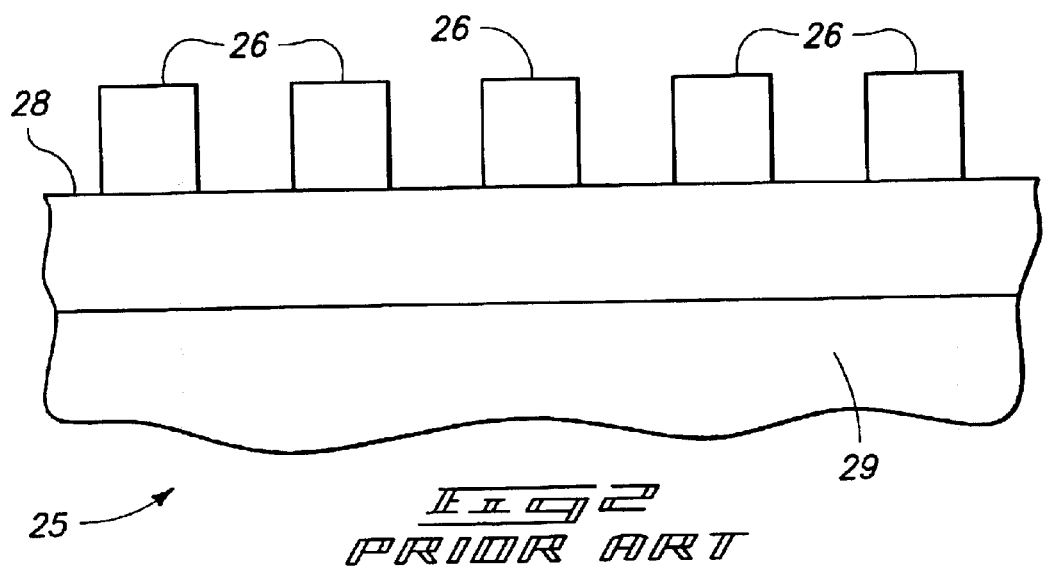
FIG. 2 is a side sectional view of the FIG. 1 prior art semiconductor wafer taken along line 2—2 in FIG. 1.
Figure 3:
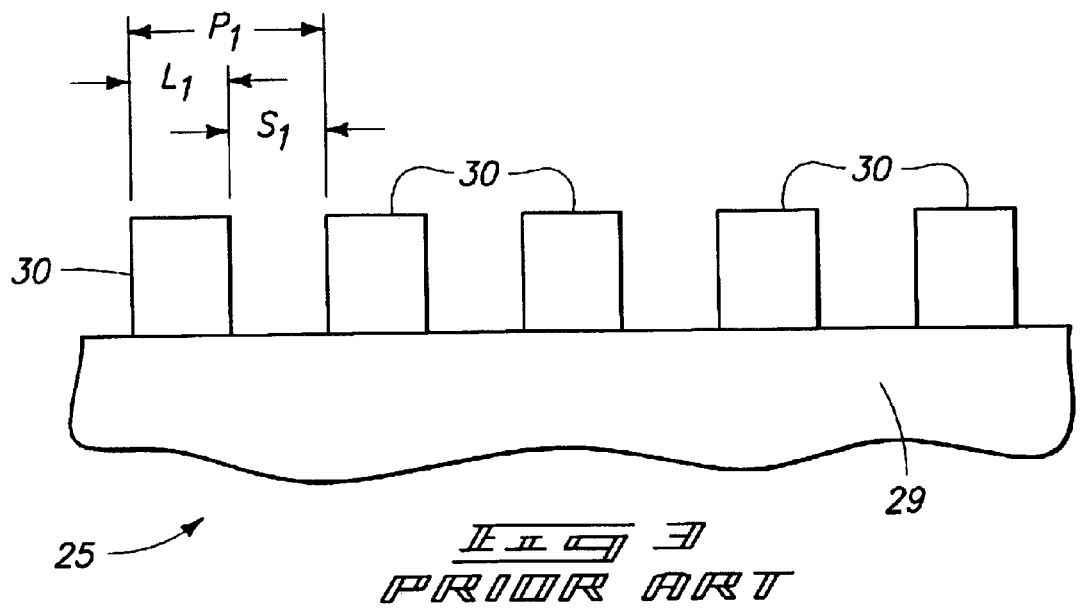
FIG. 3 is a view of the FIG. 1 prior art semiconductor wafer fragment at a processing step subsequent to that shown in FIG. 1.
Figure 4:
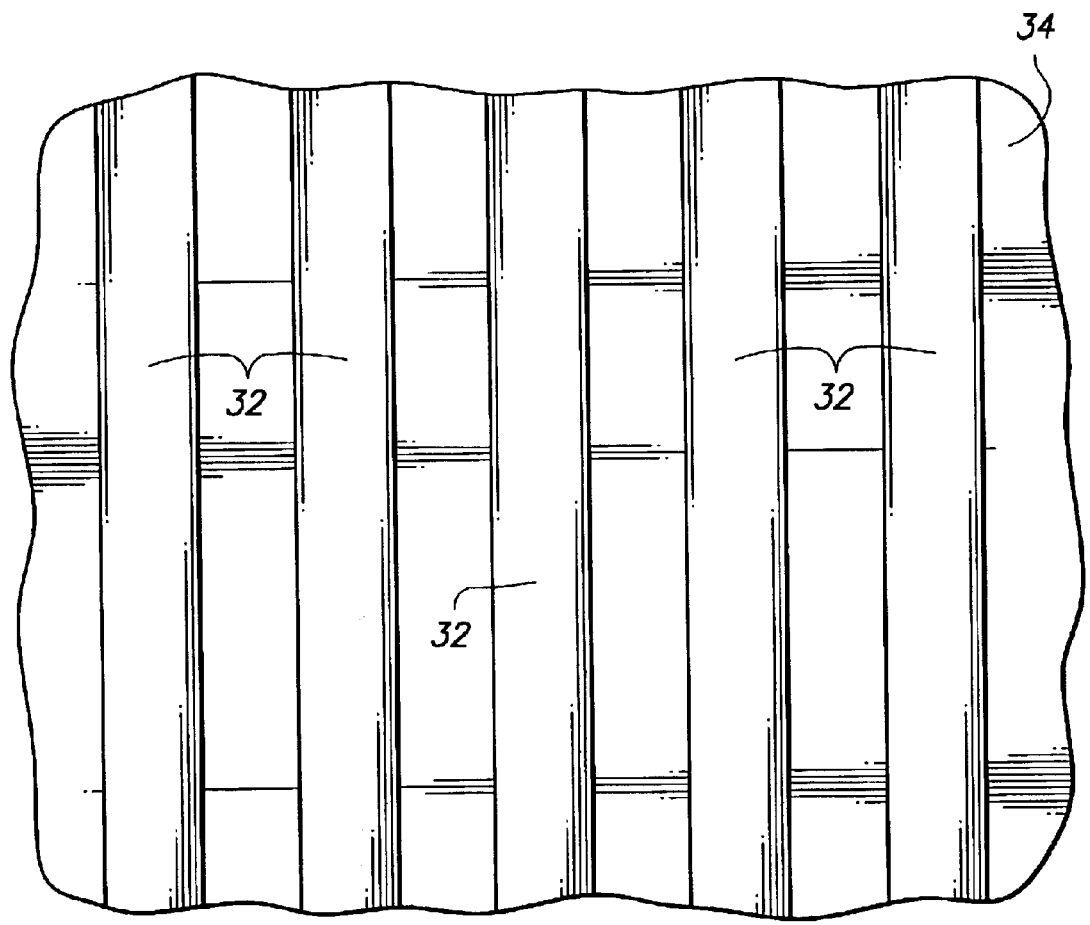
FIG. 4 is a top plan view of a semiconductor wafer fragment atop which a plurality of masking layers are formed at one processing step in accordance with one aspect of the invention.

Referring initially to FIGS. 4 and 5, a plurality of patterned device outlines 32 are photolithographically formed over a semiconductive substrate 34. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In this illustrated and preferred example, the material constituting outlines 32 is preferably of the type which can be etched selectively relative to substrate 34. Such outlines define areas over substrate 34 in which conductive lines are to be formed. Such patterned device outlines are, dimension-wise, substantially the same as those set forth with regard to patterned masking layers 26 in FIGS. 1–3.

Referring to FIG. 6, an electrically insulative material such as $SiO_2$ or $Si_3N_4$ is formed over lines 32 and substrate 34 and subsequently anisotropically etched to provide a plurality of sidewall spacers 36 on at least a portion, and preferably all, of pattern device outlines 32. For purposes of the ongoing discussion, patterned device outlines 32 define male patterns between which female patterns 38 are also formed. Accordingly, an array of alternating male/female patterns are formed over the substrate wherein sidewall spacers 36 are formed in female patterns 38.

Referring to FIG. 7, and after forming sidewall spacers 36, male patterns or patterned device outlines 32 are removed as by suitable etching techniques. The etch preferably etches device outlines 32 relative to the material forming spacers 36 and the substrate 34. Such leaves behind a plurality of upstanding sidewall spacers 36 which effectively define thin electrically insulative partitions between which a plurality of devices are to be formed. As shown, the distance or lateral spacing between adjacent spacers varies from spacer-to-spacer. According to one preferred aspect, a plurality of spaces 40a through 40i are provided wherein adjacent spaces, such as 40a and 40b differ slightly in lateral width dimension, while alternate spaces such as 40a and 40c have as shown substantially the same lateral width dimension.

Referring to FIG. 8, a conductive material 42 is formed over substrate 34 and sidewall spacers 36 and preferably completely fills spaces 40a through 40i. An example material for layer 42 is conductively doped polysilicon.

Figure 9:
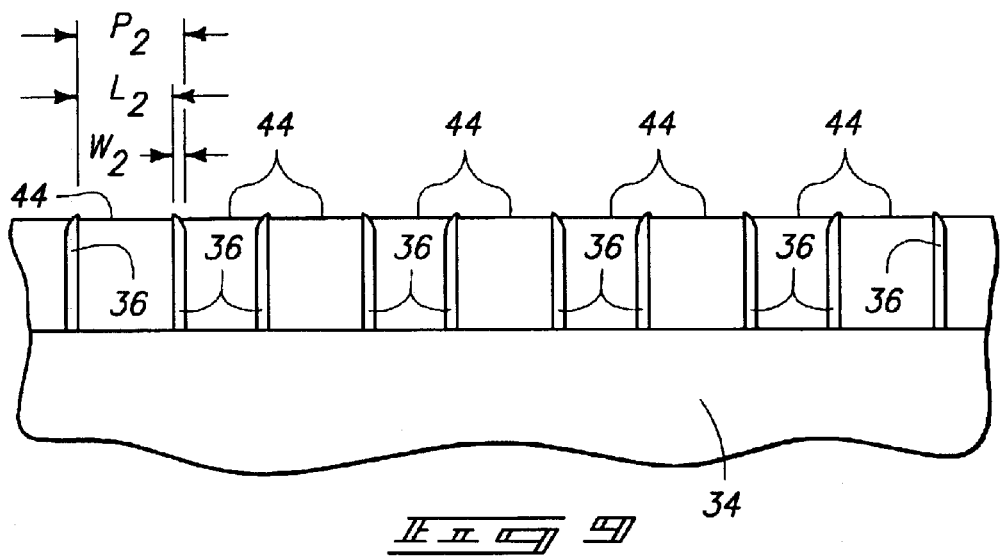
FIG. 9 is a view of the FIG. 5 semiconductor wafer fragment at a processing step subsequent to that shown by FIG. 8.

Referring to FIG. 9, conductive material 42 is etched back as by suitable methods such as a chemical-mechanical polish (CMP) or dry etching as well known in the art. Such forms a plurality of substantially identically shaped circuit devices relative to the patterned device outlines 32 (FIG. 6). In this embodiment, such devices are conductive lines 44 which are spaced laterally from one another a distance which is no greater than a width of one of the electrically insulative sidewall spacers 36 therebetween. As so formed, immediately adjacent conductive lines of the plurality of lines formed have a pitch $P_2$ which is substantially no greater than a lateral line width $L_2$ plus a width $W_2$ of the spacer 36 which is positioned between the adjacent lines. As compared to the pitch $P_1$ (FIG. 3) of the prior circuit devices, pitch $P_2$ represents a reduction in pitch which approaches fifty percent. Such achieved pitch reductions are without regard to the prior art photolithographic spacing constraints imposed on semiconductor processing. As mentioned above, the spacing between adjacent spacers varies from spacer-to-spacer. Accordingly, the pitch $P_2$ would vary as well. It is possible for the spacing between adjacent spacers to be uniform, however, so that the pitch remains constant across the substrate.

Figure 10:
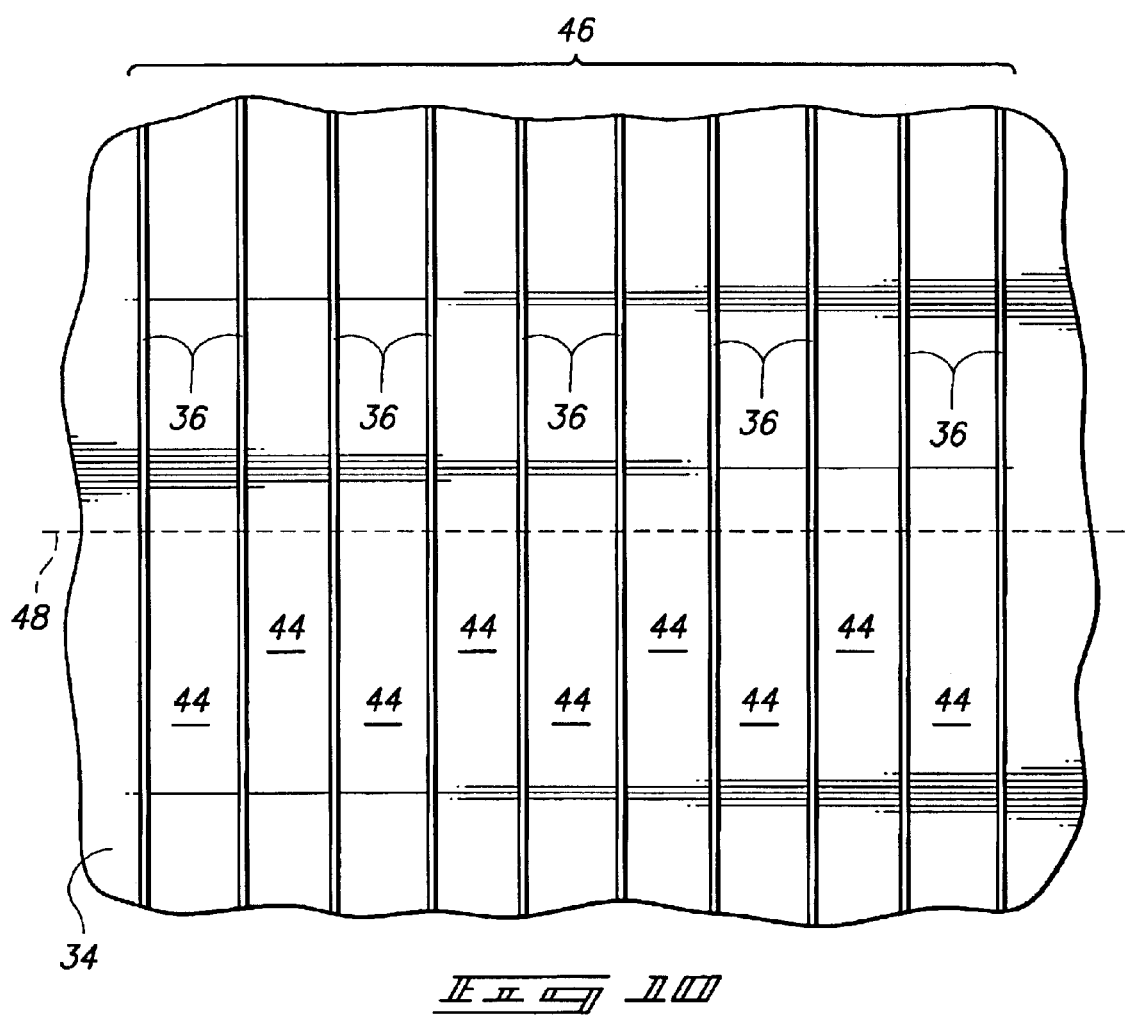
FIG. 10 is a top plan view of the FIG. 9 semiconductor wafer fragment.

Referring to FIG. 10, a top plan view of substrate 34 is shown. Conductive lines 44 collectively define a series of conductive lines which in turn define a device array 46 of substantially identically shaped devices. Array 46 includes the plurality of upstanding spacers 36 and the conductive lines 44 formed intermediate the spacers. In accordance with a preferred aspect of the invention and as described with reference to FIG. 9 above, adjacent lines have a pitch which is substantially no greater than about the distance between a pair of adjacent spacers (corresponding to the line width) plus the width of the spacer therebetween. In the illustrated example, conductive lines 44 are elongated and adjacent conductive lines have different lateral line widths. Additionally, alternate lines have substantially equal lateral line widths. Such variation in line width stems from the manner in which the anisotropically etched sidewall spacers 36 are provided over the substrate, and in particular the lateral spacing of device outlines 32 (FIG. 5). As mentioned above, it is possible for the line widths to be substantially equal over the entire substrate.

Referring still to FIG. 10, a dashed line 48 traverses device array 46. Individual elongated conductive lines 44 are formed over substrate 34 transversely along line 48. Respective alternate devices along line 48 have a substantially common width dimension therealong and respective adjacent devices have a different width dimension thereal ong.

Referring collectively to FIGS. 11–18, a semiconductor processing method of forming a plurality of alternate devices on a substrate in accordance with the above-described principles is described. According to a preferred aspect of the invention, the devices comprise capacitors, and even more preferably comprise capacitors which form part of a dynamic random access memory (DRAM) device. Circuit devices other than the illustrated and described conductive lines and capacitors can be fabricated in accordance with the invention.

In accordance with one preferred embodiment, a plurality of capacitor container openings are etched over a substrate in two separate etching steps. Thereafter, corresponding DRAM capacitors are formed within the container openings according to known processing techniques. As so formed, and in accordance with the above-described spacer formation and pitch reduction concepts, a plurality of pairs of adjacent capacitors are formed in respective adjacent capacitor containers which are separated by no more than anisotropically etched, electrically insulative sidewall spacers as will become evident below.

Figure 11:
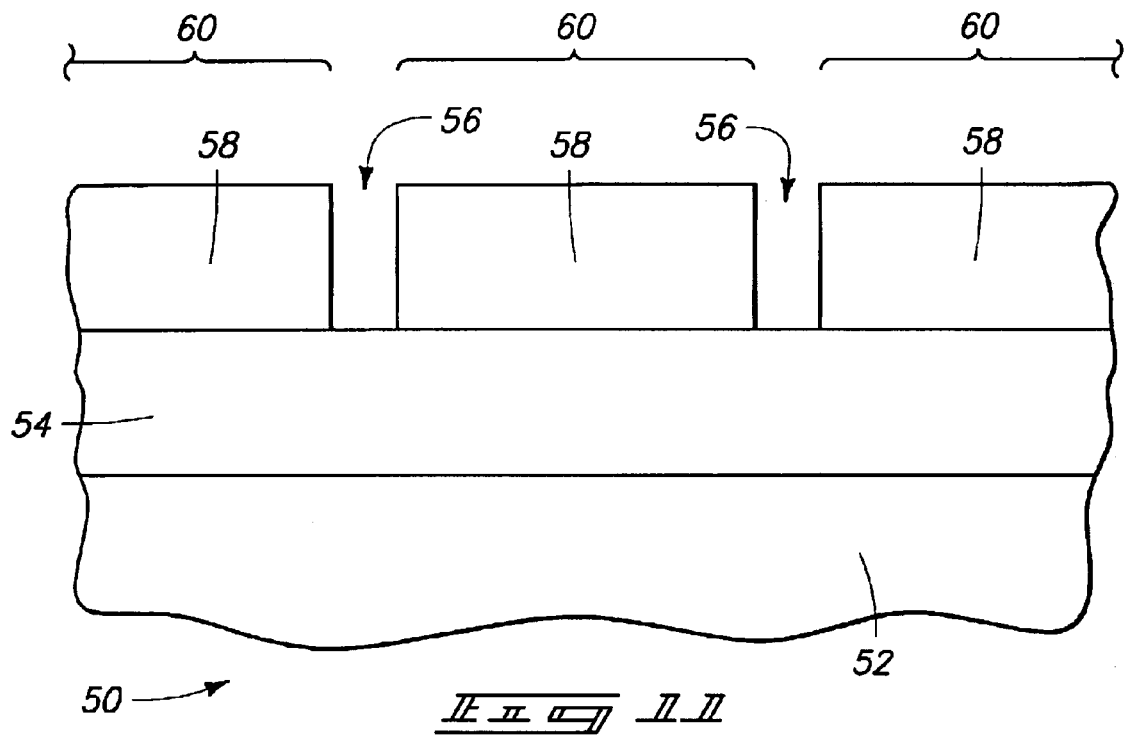
FIG. 11 is a view of a semiconductor wafer fragment at one processing step in accordance with another aspect of the invention.

Referring specifically to FIG. 11, a semiconductor wafer fragment in process is shown generally at 50 and includes a layer of material 52 which may or not may be semiconductive. Transistors forming part of the preferred DRAM circuitry array are not shown, but are formed preferably elevationally below the capacitors described hereafter. Other elevational configurations as between transistors and capacitors are possible. A layer 54, preferably of borophosphosilicate glass (BPSG), is formed over material 52 to a thickness preferably around two microns. A layer of photoresist material 58 formed over the substrate and patterned to define a plurality of bit line contact openings 56 over wafer fragment 50. The illustrated and preferred photoresist material 58 defines a plurality of patterned device outlines 60 over the substrate. Patterned outlines 60 in turn define individual areas over the substrate for supporting a plurality of capacitors to be formed as described below. Preferably, the individual areas defined by outlines 60 support two such capacitors as will be apparent.

Figure 12:
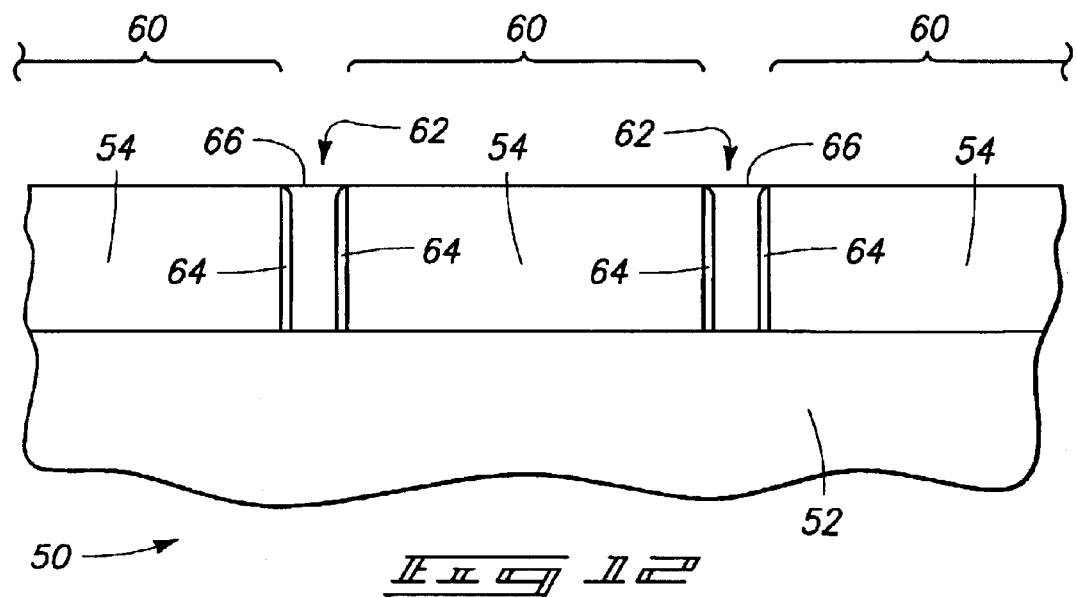
FIG. 12 is a view of the FIG. 11 semiconductor wafer fragment at a processing step subsequent to that shown by FIG. 11.

Referring to FIG. 12, layer 54 is anisotropically etched to form bit line contact openings 62 into layer 54. Photoresist material 58 is then stripped and an insulating material is formed over the substrate and into openings 62 and subsequently anisotropically etched to form the illustrated sidewall spacers 64. Thereafter, bit contact material, preferably conductively doped polysilicon, is formed over the substrate and into openings 62. Such material is or may be planarized as by suitable chemical-mechanical polishing to provide the illustrated bit line contacts or plugs 66. A plurality of contacts similar to contacts 66 are formed over the substrate during the same formation steps and bound each area 60 across the substrate in the same manner as the illustrated contacts 66 bound the centermost area 60.

Figure 13:
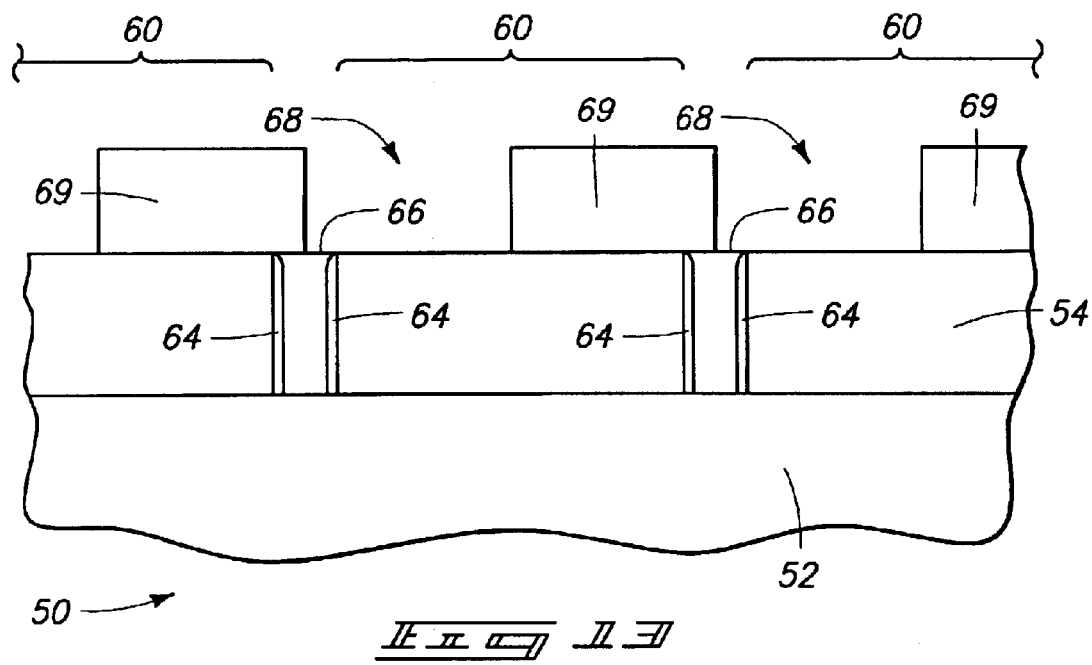
FIG. 13 is a view of the FIG. 11 semiconductor wafer fragment at a processing step subsequent to that shown by FIG. 12.

Referring to FIG. 13, a first set of capacitor container opening patterns 68 are formed over the substrate and defined by photoresist material 69. The device pattern set forth in FIG. 13 results from a semiconductor mask layout which is shown in FIG. 19 and discussed in detail below. FIG. 13 is a view which is taken along line 13—13 in FIG. 19.

Figure 14:
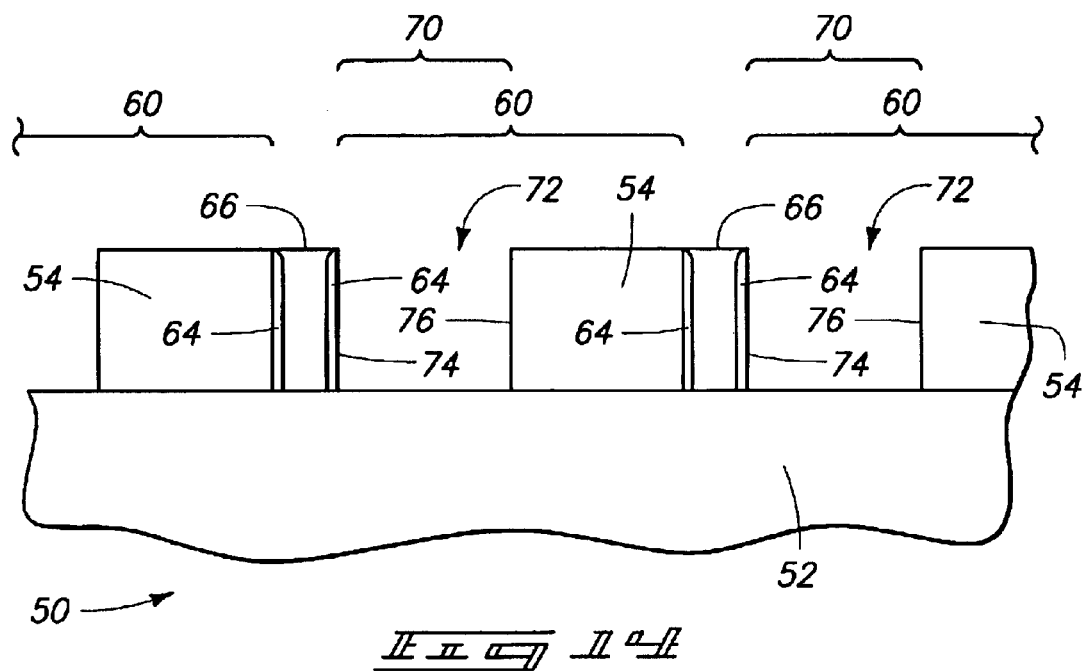
FIG. 14 is a view of the FIG. 11 semiconductor wafer fragment at a processing step subsequent to that shown by FIG. 13.

Referring to FIG. 14, a first set 70 of capacitor container openings are etched selectively relative to spacers 64 and the conductive contacts 66 through layer 54. Photoresist material 69 is then stripped away. Individual capacitor containers 72 of first set 70 have at least one, and preferably more, upright sidewalls, two of which are illustrated at 74, 76 respectively for each container 72. Upright sidewalls 74 as viewed in FIG. 14 coincide with and are defined by the rightmost sidewall spacer 64 which was previously formed.

Referring to FIG. 15, an electrically insulative material such as silicon nitride is formed over the substrate and subsequently anisotropically etched relative to layer 54, spacers 64, and bit line contacts 66 to form respective partitions or spacers 78, 80. Individual areas defined by outlines 60 are thus partitioned into two parts which are separated from one another by non-conducting partitions 78, 80, respectively, which are formed over and cover sidewalls 74, 76 respectively. As so formed, partitions 78, 80 outline individual container openings of first set 70 in which capacitors are to be formed.

Referring to FIG. 16, remaining BPSG layer 54 is selectively etched or otherwise removed relative to sidewall spacers 64, spacers or partitions 78, 80, and bit line contacts 66 to define a second set 82 of capacitor container openings to respective capacitor containers 84. As so etched, individual second set containers 84 and the respective openings thereof are disposed adjacent respective first set containers 72 to form a pair of containers (only one complete pair 72/84 of which is shown). The leftmost side of FIG. 16 shows a leftmost outline 60 which includes a complete capacitor container 84 and a portion of its paired container 72. Likewise, the rightmost side of FIG. 16 shows a rightmost outline 60 which includes a complete capacitor container 72 and a portion of its paired container 84. Individual containers of a pair are separated therefrom by no more than the width of a non-conducting partition 80. As discussed above with reference to the pitch advantages achieved with conductive lines 44 (FIGS. 9 and 10), such advantages are achieved through the use of spacers or partitions 80 which electrically isolate adjacent capacitors formed in respective areas 60.

Referring to FIGS. 17 and 18, electrically conductive container material 86 is formed over the substrate and planarized (FIG. 18) to define a plurality of capacitor storage nodes 81 in preferred container shapes. Subsequently, capacitors are formed according to conventional formation techniques as by provision of a dielectric layer 83 over respective storage nodes 81 and provision of a subsequent polysilicon layer 85 thereover. As so formed, capacitors in respective partitioned parts of the area defined by outlines 60 are separated from immediately adjacent capacitors or have a closest separation distance which is substantially no greater than the width of the partition or spacer between the capacitors.

Referring to FIG. 19, a diagrammatic semiconductor mask layout and DRAM array is designated generally by reference numeral 88. Layout 88 is utilized to enable the above-described container openings to be selectively, alternately formed or etched in the two described separate etching steps. For purposes of clarity, FIG. 13 is taken along line 13—13 in FIG. 19 at a processing point just after the patterning of photoresist material 69 (FIG. 13) with layout 88. Layout 88 enables capacitors having unique, space-saving geometries to be formed over the substrate. According to a preferred aspect of the invention, the electrically insulative partitions 78, 80 (FIG. 16) are formed between adjacent capacitors intermediate the two etching steps which form or define the areas over the substrate in which the capacitors will be formed. The partitions 78, 80 are not shown for clarity in FIG. 19.

Mask layout 88 includes a plurality of rows such as those illustrated at $R_1$, $R_2$, $R_3$, and $R_4$. The mask layout also includes a plurality of columns such as those illustrated at $C_1$, $C_2$, $C_3$, $C_4$, $C_5$, $C_6$, and $C_7$. A plurality of masked areas 90 and a plurality of adjacent unmasked areas 92 are defined by the layout. Unmasked areas 92 correspond to capacitor container opening patterns 68 in FIG. 13 and masked areas 90 correspond to photoresist material 69. Layout 88 enables a plurality of capacitors to be formed, preferably as part of a DRAM array over the substrate, wherein respective alternate capacitors in a row, such as rows $R_1$–$R_4$ have substantially similar lateral width profiles transverse the row. Preferably, respective adjacent capacitors in a row have different lateral width profiles transverse the row. The illustrated and preferred lateral width profiles when viewed from a point above the substrate approximate triangles which are oriented in a top-to-bottom fashion across the row. Additionally, individual defined areas in which the preferred capacitor pairs are to be formed (corresponding to the view taken along line 13—13 in column $C_5$) approximate a diamond shape with such shape having at its respective corners, bit line contacts 94 which are formed as described above. For purposes of the ongoing discussion, each of columns $C_1$–$C_7$ are formed along a generally straight line which is generally transverse each of rows $R_1$–$R_4$. Further, the array of capacitor pairs to be formed are formed along individual lines which contain at least one of the pairs of capacitors. As such, the array is defined by a plurality of the lines (corresponding to the plurality of the columns) which contain a plurality of capacitors which are separated by substantially no more than an electrically insulative anisotropically etched spacer as described above. Underlying word lines are shown by dashed lines 93 and interconnect associated transistors formed relative to the substrate. Individual bit lines are not specifically shown but are subsequently formed and oriented generally transversely relative to word lines 93.

Figure 20:
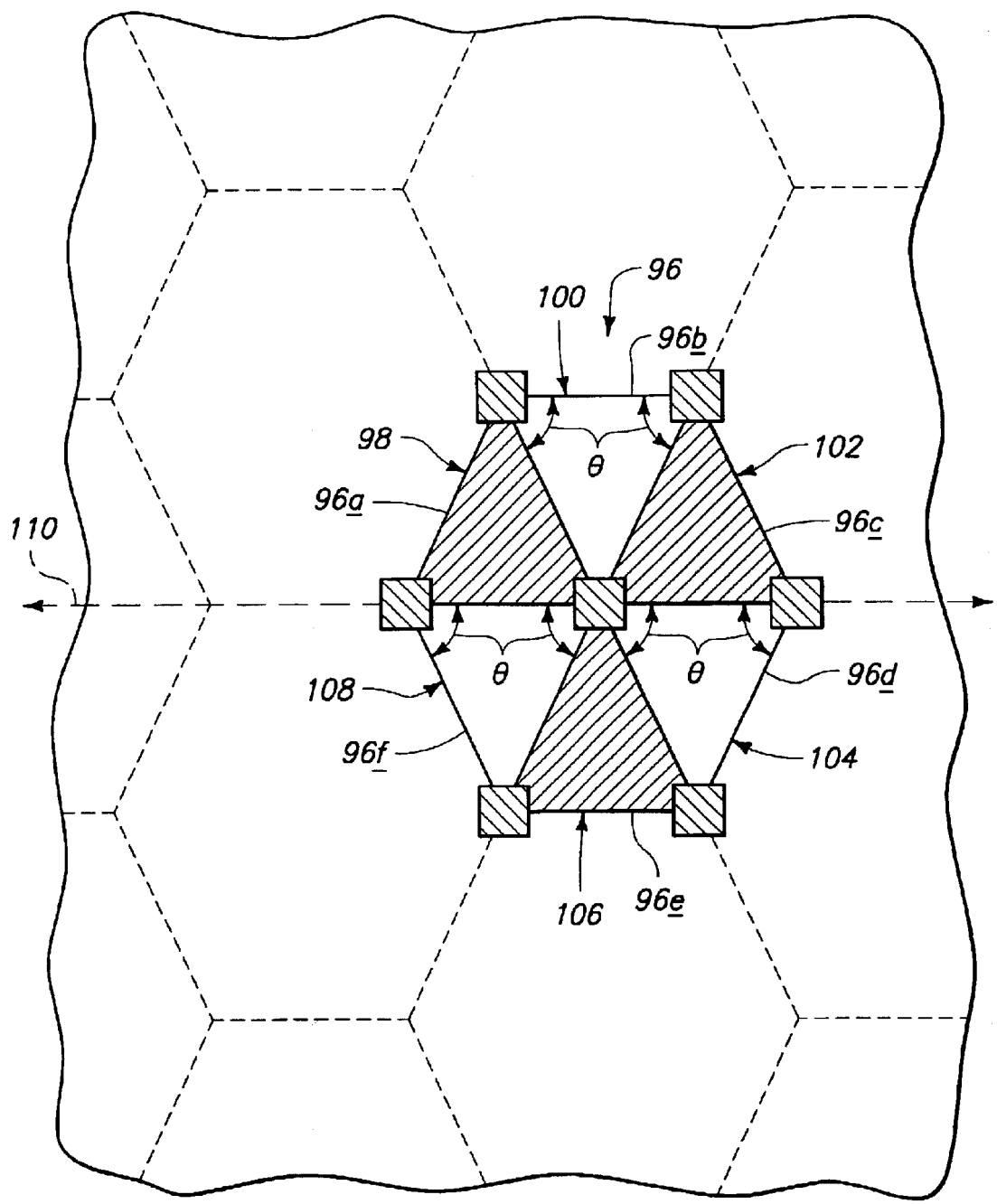
FIG. 20 is a top plan view of the FIG. 19 semiconductor mask layout with a portion highlighted for purposes of discussion.

Referring to FIG. 20, mask layout 88 defines in part a DRAM array which includes a plurality of six-capacitor geometries which are to be formed over the substrate. A representative of one of the geometries is indicated generally by reference numeral 96 and a plurality of adjacent or other geometries are shown in phantom lines. The illustrated and preferred six-capacitor geometries are, in turn, defined by a plurality of individual polygonal capacitor geometries shown collectively at 98 through 108. Preferably, collective individual capacitor geometries 98 through 108 approximate a hexagon individual sides of which are defined by a side of a different respective one of the individual polygonal capacitor geometries. For example, six-capacitor geometry or hexagon 96 includes six sides collectively shown at 96a, 96b, 96c, 96d, 96e, and 96f. Each of such sides is defined by a different respective one of the individual sides of the individual polygonal capacitor geometries 98 through 108. According to a preferred aspect of the invention, individual polygonal capacitor geometries 98 through 108, when viewed outwardly of the substrate approximate a wedge or wedge-shape. Even more preferably, such individual geometries approximate a triangle which, most preferably, is an isosceles triangle. Further, individual approximated isosceles triangles include equal adjacent angles θ which approximate a range of between about 50° to 70°. Such equal adjacent angles are shown for individual geometries 100, 104, and 108. Even more preferably, such equal adjacent angles approximate an angle of about 65°. Individual geometries 98 through 102 and 104 through 108 respectively, are preferably arranged in a top-to-bottom orientation such that hexagon 96 can be bisected, as by dashed line 110, into halves which contain exactly three individual polygonal capacitor geometries. In the illustrated and preferred hexagon, one of the halves, a top half as viewed in FIG. 20 contains individual geometries 98, 100, and 102. The other of the halves, a bottom half, contains geometries 104, 106, and 108.

Figure 21:
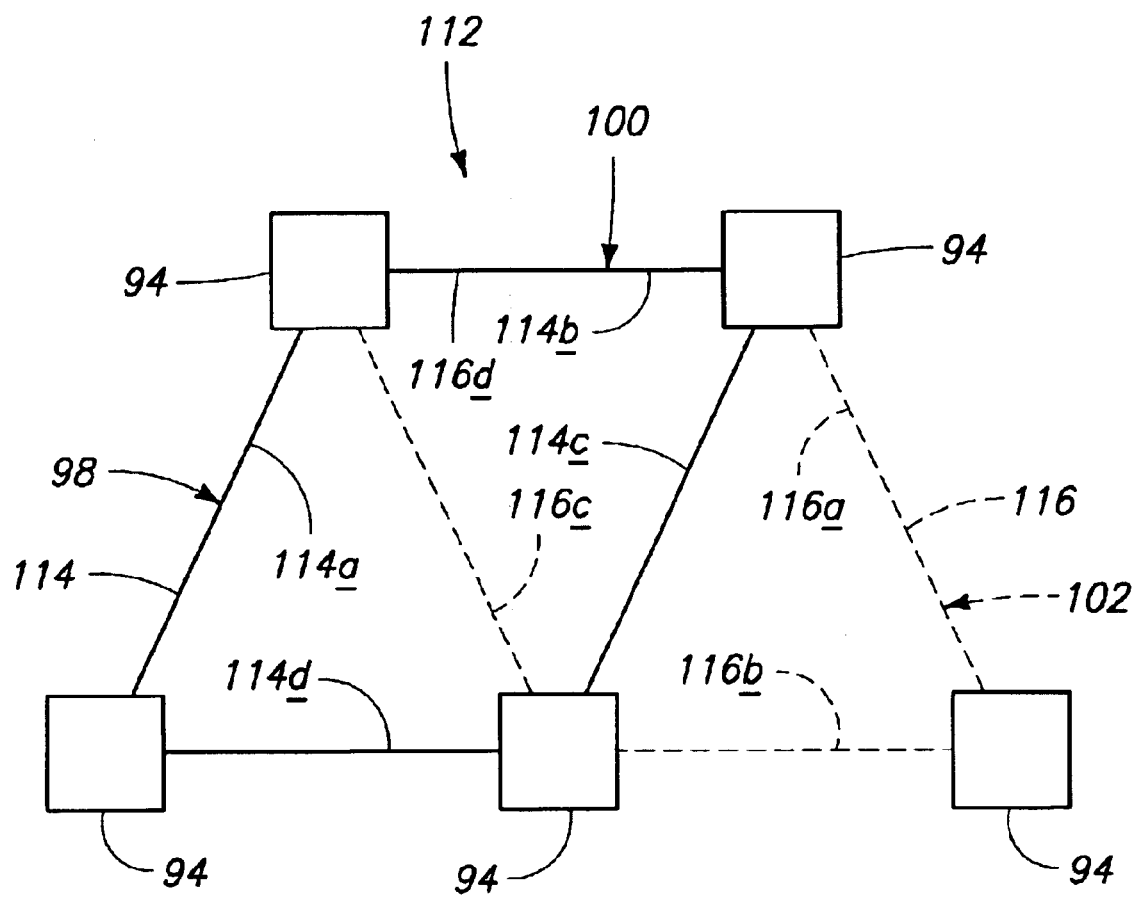
FIG. 21 is a view of a portion of the FIG. 20 semiconductor mask layout highlighted portion.

Referring to FIG. 21, the top half containing geometries 98, 100, and 102 is shown. Such comprises a three-capacitor geometry 112, a plurality of which are disposed over the substrate. Preferably, three-capacitor geometry 112, when viewed outwardly of the substrate defines a pair of overlapping approximated parallelograms, the intersection of which approximates a triangle. The first of such parallelograms is shown at 114. The second of such parallelograms is shown at 116. Parallelogram 114 includes sides 114a, 114b, 114c, and 114d. Parallelogram 116 includes sides 116a, 116b, 116c, and 116d. The parallelograms share sides 114b and 116d. As shown, each approximated parallelogram is bounded at a respective one of its corners by a bit line contact 94. The approximated triangle defined by the intersection of parallelograms 114, 116 includes sides 114c, 116c and shared sides 114b/116d. For purposes of ongoing discussion, a plurality of capacitor pairs are selectively and alternately etched over the substrate along etch axes which are generally orthogonal relative to the substrate and into the plane of the page upon which FIG. 21 appears. Such capacitor pairs can approximate the above described parallelogram and would include the individual capacitors etched as a result of individual geometries 98, 100, or alternatively 100, 102.

Referring to both FIGS. 16 and 19, a DRAM array is formed atop a substrate and includes a first set of capacitors formed in first set capacitor openings 70 over the substrate. A second set of capacitors are formed over the substrate and in second set capacitor openings 82. Individual capacitors of the first set are bounded by at least three capacitors from the second set (FIG. 19). Preferably, individual first set capacitors have a closest separation distance from at least one of the three bounding capacitors which is substantially no more than a width of an electrically insulative anisotropically etched spacer. One such width is indicated in FIG. 16 at 80. Even more preferably, individual bounded first set capacitors have closest separation distances from no less than two and preferably three of the bounding capacitors which are no more than the width of an electrically insulative anisotropically etched spacer formed or provided between the respective capacitors.

The above described semiconductor device forming methods and integrated circuitry formed thereby constitute an improvement which relates to device spacing over a substrate. Such improvement enables device pitch to be reduced by almost fifty percent or more which represents a substantial space savings over heretofore available methods and devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming integrated circuit devices comprising:

forming electrically insulative sidewall spacers on at least a portion of a plurality of patterned device outlines disposed atop a substrate; and intercalating a plurality of elongated electrically conductive lines relative to the electrically insulative sidewall spacers.

2. The method of claim 1, wherein at least two individual elongated electrically conductive lines of the plurality are spaced from one another by a distance no greater than a width of an interposed electrically insulative sidewall spacer.

3. The method of claim 1, further comprising forming the plurality of patterned device outlines over a semiconductive substrate prior to forming electrically insulative sidewall spacers.

4. The method of claim 1, wherein the plurality of conductive lines comprise a plurality of elongated electrically conductive lines formed along a line, respective alternate elongated electrically conductive lines along the line having a substantially common width dimension.

5. The method of claim 1, wherein the plurality of conductive lines comprise a plurality of elongated electrically conductive lines formed along a line, respective adjacent elongated electrically conductive lines along the line having different width dimensions.

6. The method of claim 1, further comprising:

forming a sacrificial layer atop the substrate;

forming the plurality of patterned device outlines on the sacrificial layer prior to forming electrically insulative sidewall spacers, wherein forming electrically insulative sidewall spacers on at least a portion of the plurality of patterned device outlines comprises:

anisotropically etching into the sacrificial layer to form openings therein;

forming an electrically insulative layer on the sacrificial layer and on sidewalls of the openings; and anisotropically etching the electrically insulative layer to remove the electrically insulative layer from the sacrificial layer and from bottoms of the openings but not from the sidewalls of the openings to form the electrically insulative sidewall spacers.

7. The method of claim 1, wherein forming a plurality of elongated electrically conductive lines comprises forming a plurality of substantially identically shaped elongated electrically conductive lines relative to the patterned device outlines, at least two individual elongated electrically conductive lines of the plurality being spaced from one another by a distance no greater than a width of an interposed electrically insulative sidewall spacer and having substantially identical heights.

8. A method of forming a plurality of integrated circuitry devices on a substrate comprising:

forming a plurality of spaced, upstanding, anisotropically etched electrically insulative sidewall spacers on the substrate; and in a common series of processing steps, intercalating a plurality of elongated electrically conductive lines relative to the sidewall spacers.

9. The method of claim 8, wherein adjacent elongated electrically conductive lines have a pitch substantially no greater than about the distance between a pair of adjacent sidewall spacers plus the width of the sidewall spacer between the adjacent elongated electrically conductive lines.

10. The method of claim 8, further comprising:

forming a sacrificial layer atop the substrate; and forming a plurality of patterned device outlines on the sacrificial layer, wherein forming a plurality of spaced, upstanding, anisotropically etched electrically insulative sidewall spacers on at least a portion of the patterned device outlines comprises:

anisotropically etching into the sacrificial layer to form openings therein;

forming an electrically insulative layer on the sacrificial layer and on sidewalls of the openings; and anisotropically etching the electrically insulative layer to remove the electrically insulative layer from the sacrificial layer and from bottoms of the openings but not from the sidewalls of the openings to form the electrically insulative sidewall spacers.

11. The method of claim 8, wherein forming a plurality of elongated electrically conductive lines over the substrate comprises forming the plurality of elongated electrically conductive lines such that adjacent elongated electrically conductive lines have substantially identical heights.

12. A method of forming a plurality of integrated circuitry devices on a substrate comprising:

forming a sacrificial layer atop the substrate;

anisotropically etching into the sacrificial layer to form openings therein;

forming an electrically insulative layer on the sacrificial layer and on sidewalls of the openings;

anisotropically etching the electrically insulative layer to remove the electrically insulative layer from the sacrificial layer and from bottoms of the openings but not from the sidewalls of the openings to form electrically insulating sidewall spacers; and intercalating a plurality of elongated conductive lines relative to the sidewall spacers.

13. The method of claim 11, wherein the sidewall spacers are positioned intermediate adjacent elongated conductive lines, adjacent elongated conductive lines having a pitch substantially no greater than about the distance between a pair of adjacent sidewall spacers plus the width of the sidewall spacer between the adjacent elongated conductive lines.

14. The method of claim 11, further comprising forming a plurality of patterned device outlines on the sacrificial layer prior to anisotropically etching into the sacrificial layer.

15. A method of forming integrated circuit devices comprising:

forming electrically insulative sidewall spacers on at least a portion of patterned device outlines disposed on a substrate; and intercalating a plurality of electrically conductive lines relative to the electrically insulative sidewall spacers, at least two individual elongated electrically conductive lines of the plurality being spaced from one another by a distance no greater than a width of an interposed electrically insulative sidewall spacer.

16. The method of claim 15, wherein the plurality of electrically conductive lines comprise a plurality of substantially identically shaped elongated electrically conductive lines.

17. The method of claim 15, wherein the plurality of electrically conductive lines comprise a plurality of substantially identically shaped elongated electrically conductive lines and the plurality of elongated electrically conductive lines are formed along a line, respective alternate elongated electrically conductive lines along the line having a substantially common width dimension.

18. The method of claim 15, wherein the plurality of electrically conductive lines comprise a plurality of substantially identically shaped elongated electrically conductive lines and the plurality of elongated electrically conductive lines are formed along a line, respective adjacent elongated electrically conductive lines along the line having different width dimensions.

19. The method of claim 15, wherein the plurality of electrically conductive lines comprise a plurality of substantially identically shaped elongated electrically conductive lines and wherein forming the plurality of electrically conductive lines comprises forming a plurality of substantially identically shaped elongated electrically conductive lines relative to the patterned device outlines, at least two individual elongated electrically conductive lines of the plurality being spaced from one another by a distance no greater than a width of an interposed electrically insulative sidewall spacer and having substantially identical heights.

20. A method of forming integrated circuit devices comprising:

forming a plurality of patterned device outlines over a semiconductive substrate;

forming electrically insulative sidewall spacers on at least a portion of the patterned device outlines; and forming a plurality of substantially identically shaped elongated electrically conductive polysilicon lines relative to the patterned device outlines, at least two individual elongated electrically conductive lines of the plurality being spaced from one another by a distance no greater than a width of an interposed electrically insulative sidewall spacer.

21. The method of claim 20, wherein the plurality of elongated electrically conductive lines are formed along a line, respective alternate elongated electrically conductive lines along the line having a substantially common width dimension.

22. The method of claim 20, wherein the plurality of elongated electrically conductive lines are formed along a line, respective adjacent elongated electrically conductive lines along the line having different width dimensions.

23. The method of claim 20, further comprising forming a sacrificial layer atop the substrate, wherein forming the plurality of patterned device outlines comprises forming the plurality of patterned device outlines on the sacrificial layer, and wherein forming electrically insulative sidewall spacers on at least a portion of the patterned device outlines comprises:

anisotropically etching into the sacrificial layer to form openings therein;

forming an electrically insulative layer on the sacrificial layer and on sidewalls of the openings; and anisotropically etching the electrically insulative layer to remove the electrically insulative layer from the sacrificial layer and from bottoms of the openings but not from the sidewalls of the openings to form the electrically insulative sidewall spacers.

* * * * *

UNITED STATES PATENT AND TRADEMARK OFFICE
CERTIFICATE OF CORRECTION

| | | |
|---|---|---|
| PATENT NO. | : 6,753,220 B2 | Page 1 of 1 |
| APPLICATION NO. | : 10/262481 | |
| DATED | : June 22, 2004 | |
| INVENTOR(S) | : Juengling | |

It is certified that error appears in the above-identified patent and that said Letters Patent is hereby corrected as shown below:

Column 10, line 30, Claim 13 – Replace "claim 11" with --claim 12--.

Column 10, line 37, Claim 14 – Replace "claim 11" with --claim 12--.

Column 12, line 25 – Insert --24. The method of claim 20, wherein forming a plurality of substantially identically shaped elongated electrically conductive lines comprises forming a plurality of substantially identically shaped elongated electrically conductive lines relative to the patterned device outlines, at least two individual elongated electrically conductive lines of the plurality being spaced from one another by a distance no greater than a width of an interposed electrically insulative sidewall spacer and having substantially identical heights.--

Signed and Sealed this

Seventeenth Day of April, 2007

JON W. DUDAS
*Director of the United States Patent and Trademark Office*